US008750024B2

(12) United States Patent
Bratkovski et al.

(10) Patent No.: US 8,750,024 B2
(45) Date of Patent: Jun. 10, 2014

(54) MEMCAPACITOR

(75) Inventors: Alexandre M. Bratkovski, Mountain View, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 319 days.

(21) Appl. No.: 13/256,245

(22) PCT Filed: Jun. 18, 2009

(86) PCT No.: PCT/US2009/047791
§ 371 (c)(1),
(2), (4) Date: Sep. 13, 2011

(87) PCT Pub. No.: WO2010/147588
PCT Pub. Date: Dec. 23, 2010

(65) Prior Publication Data
US 2012/0039114 A1 Feb. 16, 2012

(51) Int. Cl.
G11C 11/24 (2006.01)
(52) U.S. Cl.
USPC ......................................................... 365/149
(58) Field of Classification Search
USPC ............. 365/46, 94, 100, 113, 129, 148, 149,
365/158, 163; 257/2–5, 9, 296, 310,
257/E21.35, E31.047, E27.006; 438/29, 95,
438/96, 166, 135, 240, 259, 365, 482, 486,
438/597, 785; 977/754
See application file for complete search history.

(56) References Cited

U.S. PATENT DOCUMENTS

| 5,153,681 | A | 10/1992 | Kishimoto et al. | |
| 5,343,421 | A | 8/1994 | Brennan | |
| 6,760,245 | B2 | 7/2004 | Eaton et al. | |
| 2001/0039087 | A1 | 11/2001 | Jammy | |
| 2003/0121331 | A1 | 7/2003 | Reblewski | |
| 2005/0082593 | A1 | 4/2005 | Lee | |
| 2008/0237791 | A1 | 10/2008 | Boescke | |
| 2009/0003063 | A1 | 1/2009 | Mascolo et al. | |
| 2011/0051310 | A1* | 3/2011 | Strachan et al. | 361/281 |
| 2011/0076810 | A1* | 3/2011 | Xia et al. | 438/129 |
| 2011/0199814 | A1* | 8/2011 | Meade | 365/149 |
| 2011/0199815 | A1* | 8/2011 | Meade et al. | 365/149 |

OTHER PUBLICATIONS

Mouttet, Blaise: "An Introduction to Memipedance and Memadmittance Systems Analysis"; Jan. 30, 2009; http://knol.google.com/k/anonymous/an-introduction-to-memimpedance-and/23zgknsxnlchu/5#.

(Continued)

Primary Examiner — Harry W Byrne

(57) ABSTRACT

A memcapacitor device (100) includes a first electrode (104) and a second electrode (106) and a memcapacitive matrix (102) interposed between the first electrode (104) and the second electrode (106). Mobile dopants (111) are contained within the memcapacitive matrix (102) and are repositioned within the memcapacitive matrix (102) by the application of a programming voltage (126) across the first electrode (104) and second electrode (106) to alter the capacitance of the memcapacitor (100). A method for utilizing a memcapacitive device (100) includes applying a programming voltage (126) across a memcapacitive matrix (102) such that mobile ions (111) contained within a memcapacitive matrix (102) are redistributed and alter a capacitance of the memcapacitive device (100), then removing the programming voltage (126) and applying a reading voltage to sense the capacitance of the memcapacitive device (100).

20 Claims, 7 Drawing Sheets

(56) References Cited

OTHER PUBLICATIONS

Ventra, M.Di et al.; "Circuit elements with memory: memristors, memcapacitors and meminductors"; Jan. 23, 2009; http://arvix.org/PS_cache/arxiv/pdf/0901/0901.3682v1.pdf.

International Search Report, Feb. 2, 2010, PCT/US2009/047164.

Winkler et al , "Floating nano-dot MOS capacitor memory array without cell transistors", Microelectronic Engineering, Jun. 2004, V73174, pp. 719-724.

* cited by examiner

MEMCAPACITOR

BACKGROUND

The presence of dopants within an insulating or semiconducting matrix can dramatically alter the electrical characteristics and behavior of a device which incorporates the matrix. When a dopant/matrix combination is selected such that the dopants can move within the matrix, the electrical behavior of the device can be dynamically altered by the spatial redistribution of the dopants. In some circumstances, the motion of dopants can be induced by the application of a programming electrical field or programming voltage pulse across the matrix. After removal of the electrical field, the location and characteristics of the dopants remain stable until the application of another programming electrical field or voltage pulse. The various dopant configurations are a form of "memory" retained within the device which corresponds to past electrical conditions. According to one illustrative embodiment, changes in dopant positions can alter the capacitance of the device.

Devices which exhibit a "memory" of past electrical conditions based on changes in capacitance are often called "memcapacitors" or "memcapacitive devices." Memcapacitive behavior is most strongly evident in nanometer scale devices, where a standard driving voltage produces large electric fields. These memcapacitors could potentially be used for high density data storage, circuit calibration, or to provide self programming, fuzzy logic, or neural learning capabilities.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

Figure 1A:
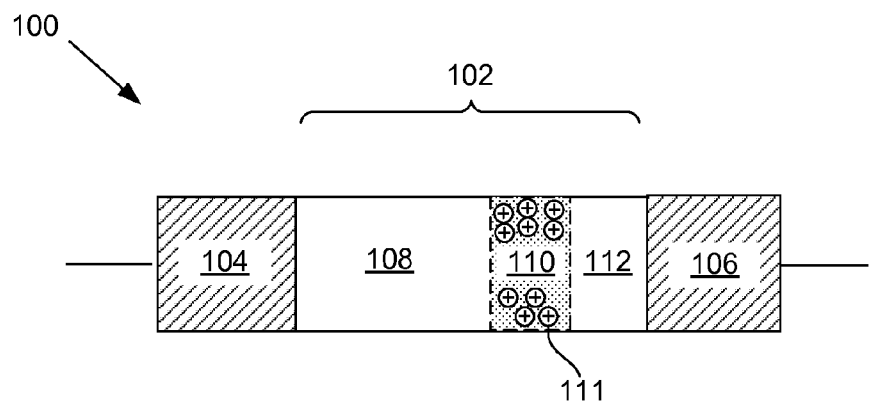
FIG. 1A is a diagram of an illustrative memcapacitor in a low capacitance state, according to one embodiment of principles described herein.

There is a long felt but unfulfilled need for electrical components which retain a memory of past conditions. For example, these electrical components could be used to store data, calibrate circuits, or provide self programming, fuzzy logic, or neural learning capabilities. An example of such an electrical component may be a solid state memory device with high storage density, no power requirement for long term data retention, and fast access times. Examples of systems which could benefit from a retained memory of past conditions may include: switching devices; self programming circuit elements; memory devices capable of multi-state storage; solid state elements which can be used to tune circuits; analog neuronal computing devices which share fundamental functionalities with the human brain; and electronic devices for applying fuzzy logic processes.

The presence of dopants within an insulating or semiconducting matrix can dramatically alter the electrical characteristics of the device. For example, dopants can be introduced into a matrix or moved within a matrix to dynamically alter the electrical capacitance of the device. In some circumstances, the motion of dopants can be induced by the application of a programming electrical field or voltage pulse across a suitable matrix. After removal of the electrical field or voltage pulse, the location and characteristics of the dopants remain stable until the application of another programming electrical field or voltage pulse.

According to one illustrative embodiment, a memcapacitive device may be a programmable capacitor or "memcapacitor." The term "memcapacitor" is derived from the combination of the two terms "memory" and "capacitor." A capacitor is a fundamental circuit element comprised of two electric conductors with a dielectric material in between. Capacitance is a measurement of the ability of the capacitor to hold electrical charge. Capacitance is related to the overlapping area of the two conductors, the distance between the conductors and the permittivity of the dielectric medium which separates the conductors. For a parallel plate capacitor, the capacitance is given by Eq. 1, below.

$$C = \varepsilon_r \varepsilon_o \frac{A}{d} \qquad \text{Eq. 1}$$

Where:
C=the capacitance in farads
A=the area of overlap between the two plates in square meters
$\varepsilon_r$=the dielectric constant of the insulator between plates
$\varepsilon_r$=the permittivity of free space
d=the separation between the plates in meters Through memcapacitive principles, a capacitor may be able to alter its capacitance based on experienced electrical conditions. The magnitude of the capacitance exhibited by the device may then be indicative of past electrical conditions. Electrical conditions which may change the locations of dopants within the memcapacitor include, but are not limited to, electrical fields, resistance induced heating, electrical current, and their combinations.

For example, when an electrical field of sufficient magnitude is applied to a memcapacitor, the dopants within the matrix material are displaced.

When the electrical field is removed from the circuit, the displacement state of the dopants allows the memcapacitor to "remember" how much voltage was previously applied and for how long. The motion of these dopants may alter the capacitance of the memcapacitor in a variety of ways. For example, the dopant motion may increase or decrease the effective distance between charged surfaces. Additionally or alternatively, the dopant motion may increase or decrease the surface area over which the charge acts or the permittivity of the insulating material separating the charged plates. The dopants remain in this displaced state over long periods of time, thereby retaining a memory of the past electrical fields applied to the device. Until another electrical field is applied to the memcapacitor which has sufficient intensity or duration to induce dopant motion, the capacitance characteristics of the memcapacitor are substantially stable.

Throughout the specification and appended claims, the term "memcapacitor" or "memcapacitive" is used to describe a combination of an insulating/semiconductor matrix and a dopant which exhibits dopant motion in the presence of a programming electrical field and the desired long term dopant stability within the matrix when the programming field is removed. The memcapacitive effect is most strongly evident in nanometer scale devices and allows the device to "remember" past electrical conditions.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

FIG. 1A shows an illustrative two-terminal memcapacitor (100). According to one embodiment, the two-terminal memcapacitor (100) is comprised of a first electrode (104) and a second electrode (106), both of which are in electrical and physical contact with one of two blocking layers (114, 115). A memcapacitive matrix (102) is disposed between the blocking layers (114, 115). In the configuration illustrated in FIG. 1A, the memcapacitive matrix (102) is made up of a lightly doped semiconductor region (108, 112) and an acceptor layer (110) which contains a number of mobile ions (111).

The electrodes (104, 106) may be constructed from a variety of conducting materials, including but not limited to: metals, metal alloys, metal composite materials, nano-structured metal materials, or other suitable conducting materials. The electrodes (104, 106) may be comprised of one or more layers. According to one illustrative embodiment, the electrodes (104, 106) have two layers: a first conducting layer which generally has low reactivity with the surrounding materials; and a metallic adhesion layer. The metallic adhesion layer can be, for example, aluminum or chromium.

Throughout the specification and appended claims, the term "memcapacitive matrix" describes a weakly ionic conductive material which is capable of transporting and hosting ions that act as dopants to control the flow of electrons through the memcapacitor. The definition of a weakly ionic conductive material is based on the application for which the memcapacitive device is designed. The mobility and the diffusion constant for a dopant species in a lattice are directly proportional to one another, via the "Einstein relation". Thus, if the mobility of ionized species in a lattice is very high, so is the diffusion constant. In general, it is desired for the memcapacitive device to stay in a particular state, either low or high capacitance, for an amount of time that may range from a fraction of a second to years, depending on the application. Thus, the diffusion constant for such a device is, in one embodiment, low enough to ensure the desired level of stability. This desired level of stability avoids inadvertently turning the device from low capacitance to a high capacitance state or vice versa via ionized species diffusion, but allows the intentionally setting the state of the switch with a voltage pulse. Therefore, a "weakly ionic conductor" is one in which the ion mobility, and thus the diffusion constant, is small enough to ensure the stability of the state of the device for as long as necessary under the desired conditions (e.g., the device does not change state because of diffusion of the dopants). In contrast, "strongly ionic conductors" would have large ionized species mobilities and thus would not be stable against diffusion.

Illustrative examples of suitable memcapacitive matrix materials are given in Table 1, below. The table lists compatible primary materials, secondary materials, and dopant species for each memcapacitive combinations. The primary material is typically a highly insulating stoichiometric compound. The secondary material is the doped version of the primary material.

TABLE 1

List of Examples of Compatible Primary and Secondary Materials and Dopant Species

| Primary Material | Secondary Material | Dopant Species |
| --- | --- | --- |
| Si | Lithium doped Si | Lithium |
| Si | Si:Ag | Silver (Ag) |
| $TiO_2$ | $TiO_{2-x}$ | Oxygen Vacancies |
| $ZrO_2$ | $ZrO_{2-x}$ | Oxygen Vacancies |
| $HfO_2$ | $HfO_{2-x}$ | Oxygen Vacancies |
| $SrTiO_3$ | $SrTiO_{3-x}$ | Oxygen Vacancies |
| GaN | $GaN_{1-x}$ | Nitrogen Vacancies |
| CuCl | $CuCl_{1-x}$ | Chlorine Vacancies |
| GaN | GaN:S | Sulfide Ions |

Table 1 is lists only illustrative examples of possible matrix and dopant combinations and is not exhaustive. A variety of other matrix/dopant combinations could be used. For example, in addition to lithium, a number of other mobile dopant species could be used in a silicon matrix. Further, other matrix materials, such as germanium, could be used with appropriate dopant species to form a memcapacitive device.

In one embodiment, the basic mode of operation is to apply a negative voltage pulse to the electrode (106) closest to the acceptor layer (110) large enough to heat and redistribute the mobile ions (111) into one of the lightly doped semiconducting regions (108, 112). The mobile ions (111) are specifically chosen from those that act as electrical dopants for the memcapacitive matrix (102), and thereby varying the capacitance of the device.

As discussed above, the memcapacitive matrix (102) and the dopant species are chosen such that the drift of the dopants (111) within the memcapacitive matrix (102) is possible but not too facile, to ensure that the device (100) will remain in whatever state it is set for a reasonably long time, perhaps many years at room temperature. This ensures that the memcapacitive device (100) is nonvolatile, that is, that it holds its state after the programming voltage has been removed. The memcapacitive device (100) can then act as a storage element which can be read multiple times and remains stable over the desired duration.

The semiconducting regions (108, 112) within the memcapacitive matrix (102) may be made up of a variety of semiconductive material and is in many cases nanocrystalline or amorphous. There are many materials which could be used to makeup the semiconducting regions (108, 112) including but not limited to silicon and germanium.

In one embodiment, the acceptor layer (110) within the memcapacitive matrix (102) may be made of a semiconductor material doped with acceptor atoms. The purpose of the acceptor layer (110) is to form a region within the memcapacitive matrix (102) in which the mobile dopant atoms (111) are more tightly and stably constrained due to their interaction with the oppositely charged acceptor layer (110). A typical semiconductor is made from elements in the group 14 section of the period table of elements which includes among others carbon, silicon, and germanium. The elements in this column each contain four valence electrons. When doping semiconductor material with acceptors, an element from the group 13 section of the periodic table of elements is used. This group includes among others, boron, aluminum, and gallium. Elements from this group contain three valence electrons. When elements from group 13 are bonded with elements from group 14, electron "holes" exist throughout the lattice.

According to one illustrative embodiment, a portion of the memcapacitive matrix (102) is doped with acceptor atoms to form the acceptor layer (110). The injection of these acceptor atoms can be performed in a variety of ways including ion deposition, chemical vapor deposition, or other techniques. Typically, the acceptor atoms within the acceptor layer (110) are relatively immobile and create a charge which is opposite that of the mobile dopants (111). Consequently, the mobile dopants (111) are attracted to and more stably contained within the acceptor layer (110) than other regions within the memcapacitive matrix (102).

Figure 1B:
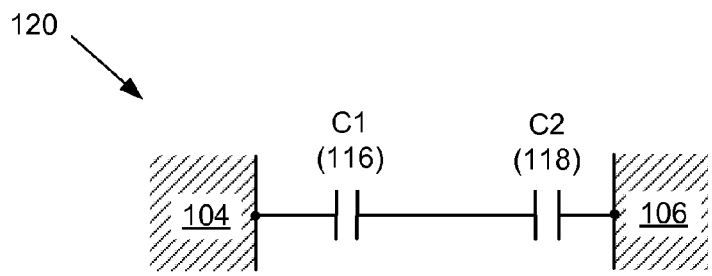
FIG. 1B is a diagram of an illustrative circuit schematic for a memcapacitor in a low capacitance state, according to one embodiment of principles described herein.

FIG. 1B is a circuit schematic representation (120) of the memcapacitor (100). Capacitor C1 (116) represents the capacitance created by the first electrode (104) and the mobile ions (110) serving as conducting surfaces with the lightly doped semiconductor region (108) serving as the dielectric material in between the two conducting surfaces. Capacitor C2 (118) represents the capacitance created by the mobile ions (110) and the second electrode (106) serving as conducting surfaces with the matrix region (112) serving as the dielectric between the two surfaces. Capacitor C1 (116) and capacitor C2 (118) are in series. The total capacitance of capacitors in series is given below in by Eq. 2.

$$C_{total} = \frac{C_1 * C_2}{(C_1 + C_2)} \quad \text{Eq. 2}$$

Where:
$C_{total}$=the total capacitance of the device in farads
$C_1$=the capacitance of the first capacitor
$C_2$=the capacitance of the second capacitor which is in series with the first capacitor.

As can be seen from Eq. 1, the arrangement of capacitors $C_1$ and $C_2$ in series always results in a total capacitance that is less than $C_1$.

Figure 1C:
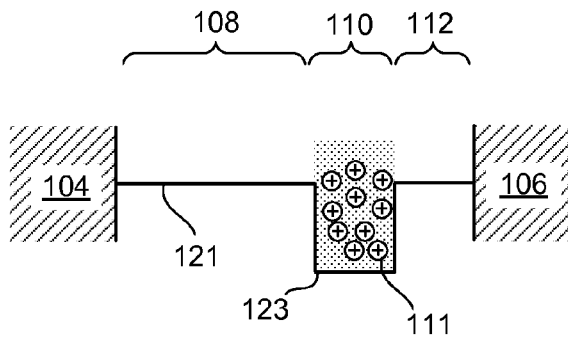
FIG. 1C is a diagram showing illustrative electrical potentials and dopant distributions in various regions of a memcapacitor in a low capacitance state, according to one embodiment of principles described herein.
Figure 1D:
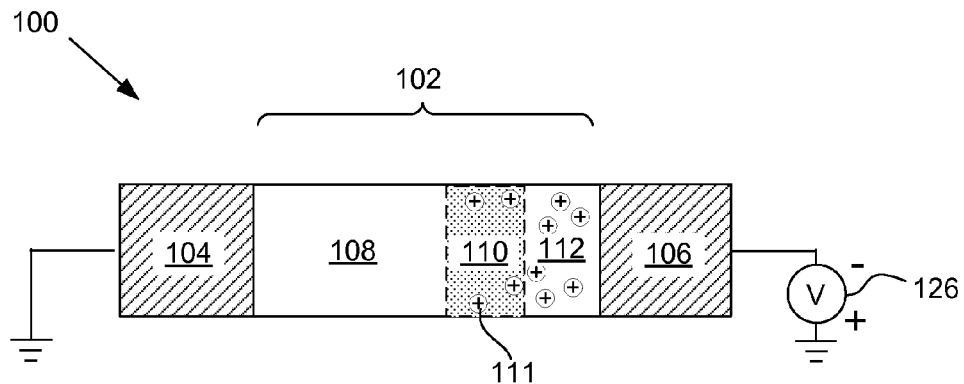
FIG. 1D is a diagram of an illustrative memcapacitor in a high capacitance state, according to one embodiment of principles described herein.

FIG. 1C is an illustrative diagram depicting the electrical potential of various regions of a memcapacitor in its low capacitance state. As shown in FIG. 1A, the matrix (102) is divided into three regions. The acceptor layer (110) divides the matrix (102) into two lightly doped semiconducting regions (108, 112). Because the semiconductor in the lightly doped regions (108, 112) is essentially non-doped, the electrical potential (121) is at the intrinsic level of the matrix. The negative charge of the acceptor layer (110) creates a negative potential well for positive charges (123). The positively charged mobile ions (111) tend to congregate in this well. As the density of the dopants rises, the density of free electrons also increases, making the acceptor layer (110) more conductive. In general, the relationship between electrical conductivity and electron density is given by the following equation:

$$\sigma = n * e * \mu \quad \text{Eq. 1}$$

where:
$\sigma$=electrical conductivity of the material as a function of electron concentration.
n=density of electrons
e=electrical charge of an electron
$\mu$=electron mobility FIG. 1D illustrates an application of a programming voltage (126) which changes the state of the memcapacitor (100) from a low capacitance state to a high capacitance state. In one illustrative embodiment, the programming voltage (126) applies a negative voltage to the right electrode (106). The right electrode (106) is closest to the acceptor layer (110) which contains mobile dopants (111). The applied voltage (126) may influence the redistribution of the mobile dopants (111) in several ways. First, the applied voltage (126) creates an electrical field which attracts the mobile dopants to the right electrode (106). Second, the applied voltage (126) may heat the memcapacitive matrix (102), which increases the diffusion rate of the mobile ions (111) within the memcapacitive matrix (102). This allows the mobile ions (111) to more quickly and easily be moved to the desired location within the memcapacitive matrix (102). According to one illustrative embodiment, a portion of the mobile ions (111) are pulled into the right semiconducting region (112) and significantly increase its electrical conductivity. After the application of the programming voltage (126), these mobile ions (111) will remain in the semiconducting region (112) during multiple read cycles or until another programming voltage is applied.

The characteristics of the programming voltage determine how the mobile ions (110) are redistributed. For example, the polarity of the programming voltage (126) determines if the mobile dopants (111) move to the left or right through the memcapacitive matrix (102). The duration and intensity of the programming voltage (126) determine the distance and number of ions that are displaced within the matrix (102).

In the state illustrated in FIG. 1D, the lightly doped semiconductor region (108) between the left electrode (104) and the mobile ions (111) maintains its capacitance. However, the matrix region (112) has become conductive as a result of the motion of dopants (111) into this matrix region (112). Consequently, the capacitive behavior represented by the right capacitor C2 (118, FIG. 1B) no longer exists.

Figure 1E:
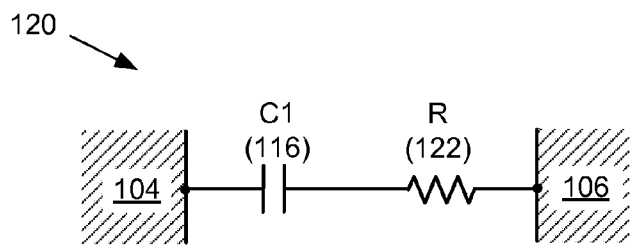
FIG. 1E is a diagram of an illustrative circuit schematic for a memcapacitor in a high capacitance state, according to one embodiment of principles described herein.

FIG. 1E is a circuit schematic representation (120) of the memcapacitor (100) in the state illustrated in FIG. 1D Capacitor C1 (116) represents the capacitance created by the left electrode (104) and the mobile ions (110) which serve as conducting surfaces. The lightly doped region (108) serves as the dielectric material between the two conducting surfaces. The resistor (122) represents a small resistance of the matrix region (112) between the acceptor layer (110) and the right electrode (106).

As a result of the elimination of capacitor C2 (118, FIG. 1B) the total capacitance of the device (100) has significantly increased when compared to the state illustrated in FIGS. 1A-1C. The total capacitance of the entire device is now made up primarily from capacitor C1 (116). For example, if the values of the capacitance of capacitor C1 and capacitor C2 are arbitrarily designated as having a numeric value of 2 picofarads, the total capacitance of the configuration illustrated in FIGS. 1A-1C can be determined through the application of Eq. 1. By substituting the value of 2 picofarads for the C1 and C2 variables in Eq. 1, it can be shown that the total capacitance of the memcapacitor is 1 picofarad. However, when capacitor C2 is eliminated as shown in FIGS. 1D-1F, the capacitance of the memcapacitor is equal to the capacitance of the remaining capacitor C1 (116), which equals 2 picofarads.

Figure 1F:
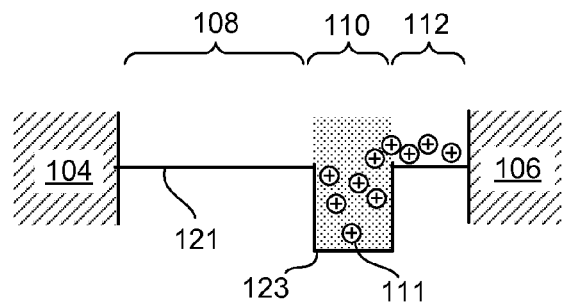
FIG. 1F is a diagram showing illustrative electrical potentials and dopant distributions in various regions of a memcapacitor in a high capacitance state, according to one embodiment of principles described herein.

FIG. 1F is an illustrative diagram depicting electrical potentials in various regions of the memcapacitor in a high capacitance state. When the voltage pulse is applied, a portion of the mobile ions (111) are redistributed toward the right electrode (106). These mobile ions (111) increase the doping levels of the right matrix section (112) and substantially increase its electrical conductivity.

Figure 1G:
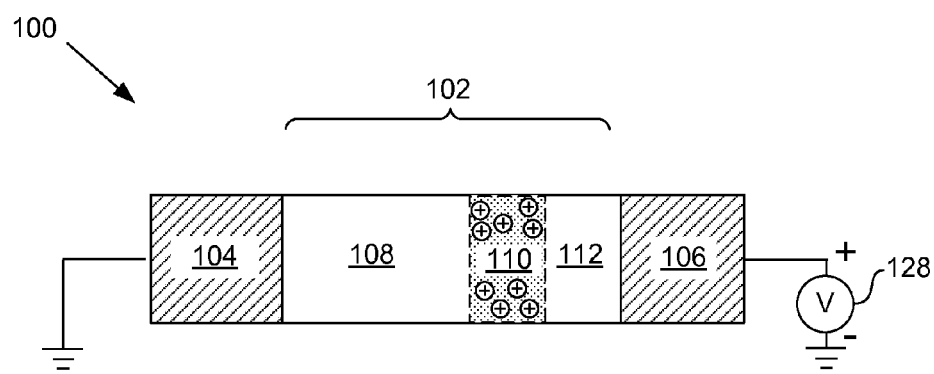
FIG. 1G is a diagram showing the illustrative memcapacitor returning back to a low capacitance state, according to one embodiment of principles described herein.

FIG. 1G shows that the application of a programming voltage with an opposite polarity can return the memcapacitor (100) to its low capacitance state. In this illustrative embodiment, a positive voltage pulse (128) is applied to the right electrode (106). This positive voltage repels the mobile dopants (111) and moves them back into the acceptor layer (110). This returns the right matrix region (112) to its intrinsic and insulating state. This reestablishes the capacitance C2 (118) and reduces the overall capacitance of the memcapacitive device (100).

Figure 1H:
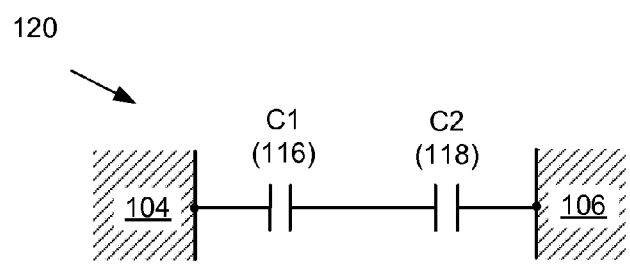
FIG. 1H is a diagram of an illustrative circuit schematic for a memcapacitor which has been returned to its low capacitance state, according to one embodiment of principles described herein.

FIG. 1H is a circuit schematic representation (120) of the memcapacitor back in its original state. Capacitor C1 (116) represents the capacitance created by the left electrode (104) and the mobile ions (110) serving as conducting surfaces with the lightly doped region (108) serving as the dielectric material in between the two conducting surfaces. Capacitor C2 represents the capacitance created by the mobile ions (110) and the left electrode (106) serving as conducting surfaces with the acceptor layer (112) void of mobile ions (110) as the dielectric between the two surfaces.

Though only two states are shown in the above figures, the memcapacitive device may be configured in a number of other states. Based on the polarity, strength, and duration of applied programming voltages, various distributions of mobile dopants can be achieved.

The combination of materials and ions which make up the memcapacitor is selected to achieve the desired mobility of the mobile dopant species and the stability of the acceptor ions. According to one illustrative embodiment, a silicon matrix (102) could be used and the acceptor layer (110) may be doped with boron acceptor atoms. The boron acceptor atoms are negative charged ions and are relatively immobile within the silicon matrix (102). The mobile dopant species may be lithium ions, which have a positive charge and have a mobility within the silicon matrix which is orders of magnitude higher than the boron acceptor atoms. The lithium mobile dopants (111) are attracted to the negatively charged boron acceptor atoms within the acceptor layer (110).

Figure 2:
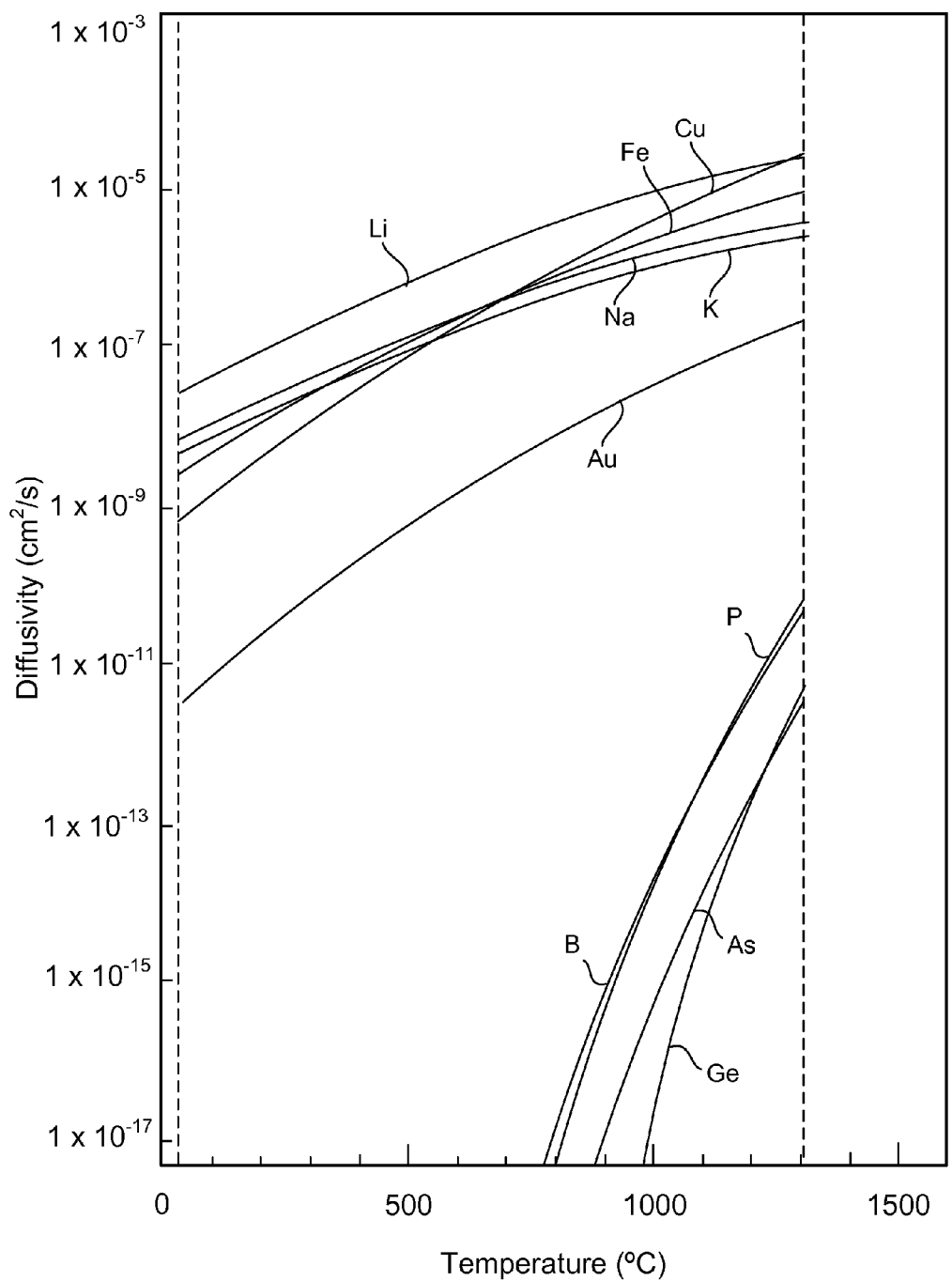
FIG. 2 is a graph which shows the diffusivity of various dopants in a silicon matrix as a function of temperature, according to one embodiment of principles described herein.

FIG. 2 is a graph illustrating various diffusivities of dopants within silicon as a function of temperature. The horizontal axis shows temperature in degrees Celsius and the vertical axis is a logarithmic scale of diffusivity in centimeters squared per second. As can be seen from the graph of FIG. 2, boron (B) has a relatively low diffusivity through a silicon matrix. At normal operating temperatures of a memcapacitive device (such as below 700 degrees), the diffusivity of boron is less than $1 \times 10^{-17}$ centimeters squared per second. In contrast, the mobility of lithium (Li) is significantly higher over the entire temperature range illustrated in the graph. At room temperature lithium has a diffusivity of approximately $1 \times 10^{-7}$ centimeters squared per second. The diffusivity of lithium increases with temperature. According to one illustrative embodiment, the matrix could be resistively heated to increase the mobility of the lithium during writing or programming the memcapacitive device. The memcapacitive device then cools and the mobility of the lithium decreases and remains more stable during the operations which read the state of the memcapacitive device. Lithium and boron are only one illustrative example of mobile and acceptor dopants which could be used in a silicon matrix. A few additional species are shown in FIG. 2. A variety of other dopant combinations could be used.

Further, a number of other matrix materials could be used and various combinations of acceptor dopant species and mobile dopant species could be selected to provide the desired memcapacitive behavior. For example, Table 1 is a non-exhaustive list of illustrative memcapacitive matrix materials which could be used.

Figure 3A:
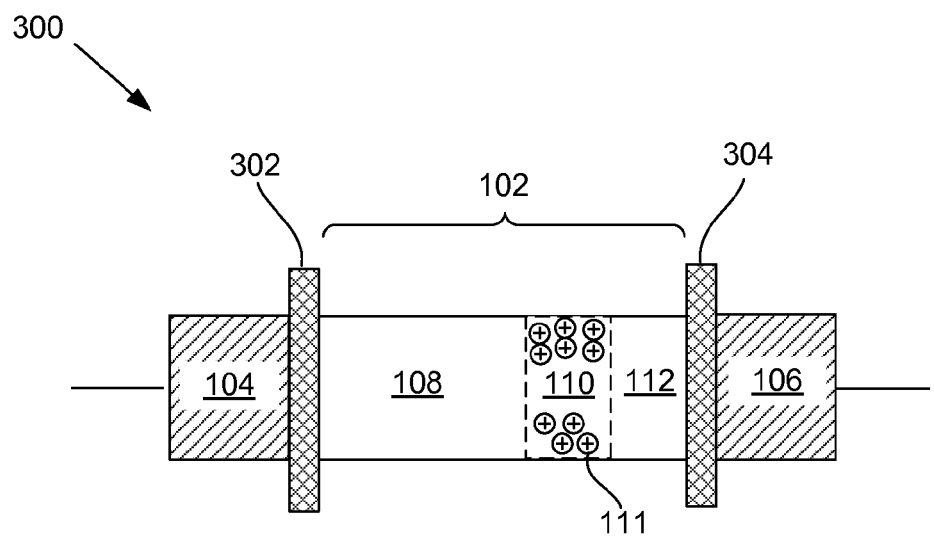
FIGS. 3A and 3B are diagrams of alternative embodiments of memcapacitive devices, according to one embodiment of principles described herein.

The memcapacitor configuration shown in FIGS. 1A-1G is only one illustrative embodiment of a memcapacitor. A variety of other layers, electrode geometries, and other configurations could be used. FIG. 3A illustrates one alternative embodiment of a memcapacitor (300). In this embodiment, blocking layers (302, 304) are interposed between the electrodes and the memcapacitive matrix (102). These blocking layers (302, 304) may serve a number of functions including preventing the mobile dopant species (111) from interacting with the electrode material or otherwise escaping the memcapacitive matrix (102).

Additionally or alternatively, the memcapacitive matrix (102) may be a heterostructure in which the left region (108) is a different material than the acceptor and right regions (110, 112). For example, the left region (108) may be selected such that it is not permeable by the mobile dopant species (111). This may provide a number of advantages, including restricting mobile dopant motion to the acceptor and right regions (110, 112).

Figure 3B:
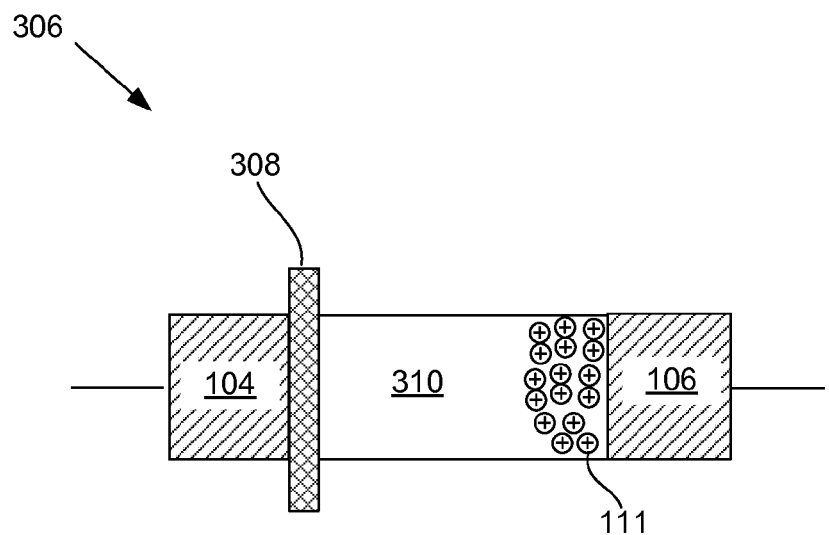

In some embodiments, the acceptor layer (110) may not be included in the memcapacitor. FIG. 3B shows an illustrative embodiment of a memcapacitor (306) which has a dielectric blocking layer (308) interposed between the left electrode and a memcapacitive matrix (310). Mobile dopants (111) can be programmed with various distributions within the memcapacitive matrix (310) by the application of appropriate programming voltages across the two electrodes (104, 106). The memcapacitor (306) could be programmed in a high capacitance state by moving the mobile dopants (111) to contact the right electrode (106) as illustrated in FIG. 3B. To reduce the capacitance of the memcapacitor (306), the mobile dopants (111) could be moved to the right and out of electrical contact with the right electrode (106).

A variety of other memcapacitor configurations could be used, including memcapacitors with more than two electrodes, multiple mobile dopant species, and other configurations.

As briefly discussed above, memcapacitors may be incorporated into a number of electrical devices, including memory arrays, integrated circuits, switches, multiplexers, de-multiplexers, etc. According to one illustrative embodiment, memcapacitors may be incorporated into a crossbar architecture. A crossbar architecture typically comprises a lower set of generally parallel wires which are overlaid by an upper set of perpendicular wires. The memcapacitive junctions are formed at the intersections between the upper wires and the lower wires. As discussed above, the memcapacitive junctions can be programmed to vary the electrical capacitance between the upper wires and lower wires.

Figure 4:
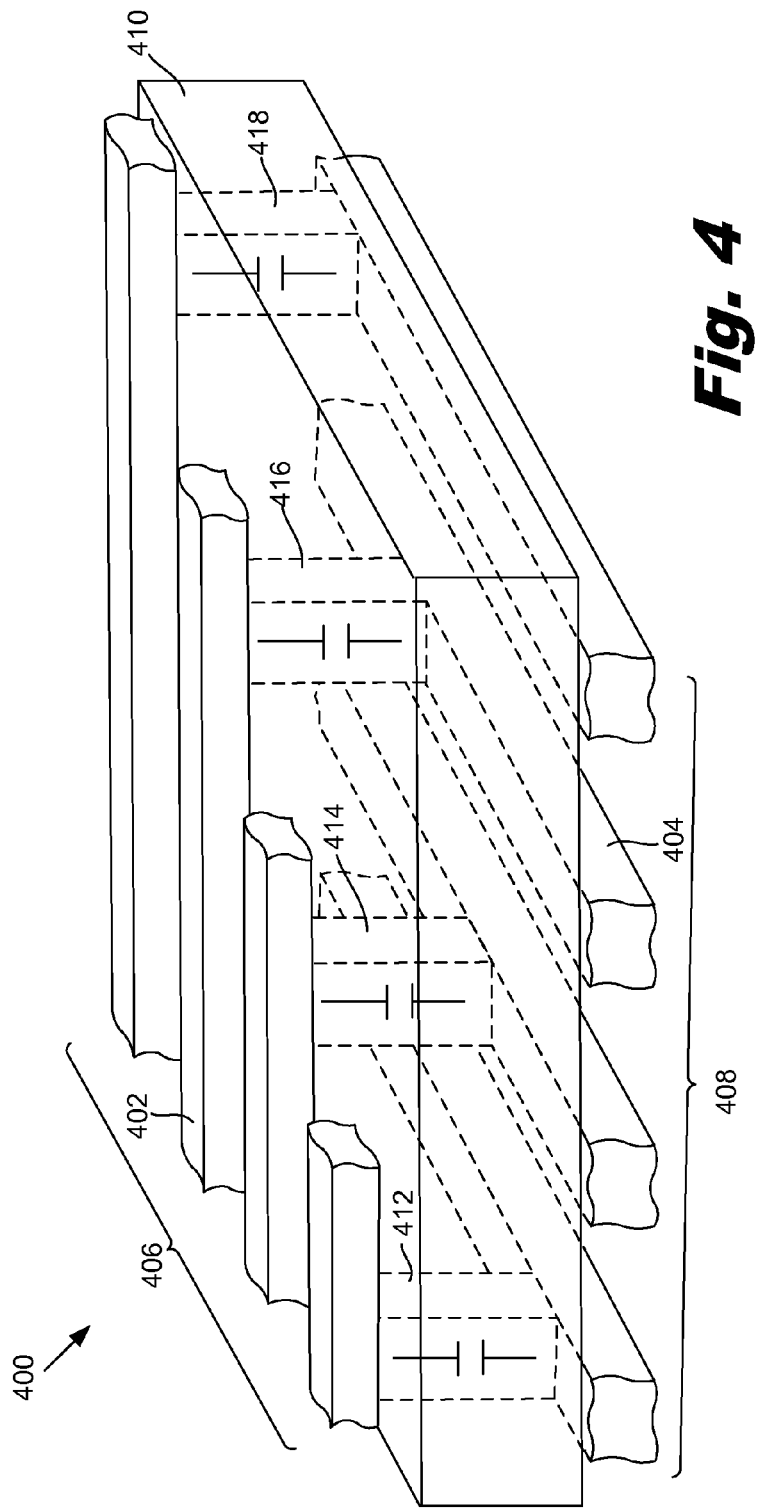
FIG. 4 is an isometric view of an illustrative nanowire crossbar architecture incorporating memcapacitive devices, according to one embodiment of principles described herein.

FIG. 4 shows an isometric view of an illustrative nanowire crossbar architecture (400). As discussed above, the crossbar array (400) is composed of a lower layer of approximately parallel nanowires (408) that are overlain by an upper layer of approximately parallel nanowires (406). The nanowires of the upper layer (406) are roughly perpendicular, in orientation, to the nanowires of the lower layer (408), although the orientation angle between the layers may vary. The two layers of nanowires form a lattice, or crossbar, in which each nanowire of the second layer (406) overlies all of the nanowires of the first layer (408). The memcapacitors (412, 414, 416, 418) may be formed between the crossing nanowires at these intersections to creating a memcapacitive junction. Consequently, each wire (402) in the upper layer (406) is connected to every wire in the lower layer (408) through a memcapacitive junction and visa versa. At the intersections, the upper nanowires (406) form the first electrode (104, FIG. 1A) and the lower nanowires (408) form the second electrode (106, FIG. 1A). These junctions may perform a variety of functions including providing programmable switching between the nanowires. Because every wire in the first layer of nanowires (408) intersects each wire in the second layer of nanowires (406), placing a memcapacitive junction at each intersection allows for any nanowire in the first layer (408) to be selectively connected to any wire in the second layer (406).

According to one illustrative embodiment, the nanowire crossbar architecture (400) may be used to form a nonvolatile memory array. Each of the memcapacitive junctions (412, 414, 416, 418) may be used to represent one or more bits of data. For example, in the simplest case, a memcapacitive junction may have two states: a low capacitive state and a high capacitive state. The high capacitive state may represent a binary "1" and the low capacitive state may represent a binary "0", or visa versa. Binary data can be written into the crossbar architecture (400) by changing the capacitive state of the memcapacitive junctions. The binary data can then be retrieved by sensing the state of the memcapacitive junctions (412, 414, 416, 418).

Although individual nanowires (402, 404) in FIG. 4 are shown with rectangular cross sections, nanowires can also have square, circular, elliptical, or more complex cross sections. The nanowires may also have many different widths or diameters and aspect ratios or eccentricities. The term "nanowire crossbar" may refer to crossbars having one or more layers of sub-microscale wires, microscale wires, or wires with larger dimensions, in addition to nanowires. Additionally, the memcapacitive matrix (102, FIG. 1A) may be made in any dimension necessary to accomplish the design goals of the system which employs the memcapacitor. Likewise, other aspects of the memcapacitor including the lightly doped semi-conducting region (108, FIG. 1A), the blocking layers (302, 304; FIG. 3A), and the electrodes (104,106; FIG. 1A) may be of any dimension necessary to allow the memcapacitor to meet the design goals the system into which is to be integrated.

The layers may be fabricated using a variety of techniques including conventional photolithography as well as mechanical nano-imprinting techniques. Alternatively, nanowires can be chemically synthesized and can be deposited as layers of approximately parallel nanowires in one or more processing steps, including Langmuir-Blodgett processes. Other alternative techniques for fabricating nanowires may also be employed, such as interference lithography. Many different types of conductive and semi-conductive nanowires can be chemically synthesized from metallic and semiconductor substances, from combinations of these types of substances, and from other types of substances. A nanowire crossbar may be connected to microscale address-wire leads or other electronic leads, through a variety of different methods in order to incorporate the nanowires into electrical circuits.

The example above is only one illustrative embodiment of the nanowire crossbar architecture (400). A variety of other configurations could be used. For example, the crossbar architecture (400) can incorporate memcapacitive junctions (412, 414, 416, 418) which have more than two states.

In another example, crossbar architecture can be used to form implication logic structures and crossbar based adaptive circuits such as artificial neural networks.

According to one illustrative embodiment, a nanowire cross bar memory or other memcapacitor device is integrated into CMOS or other conventional computer circuitry. This CMOS circuitry can provide additional functionality to the memcapacitor device such as input/output functions, buffering, logic, or other functionality.

Figure 5:
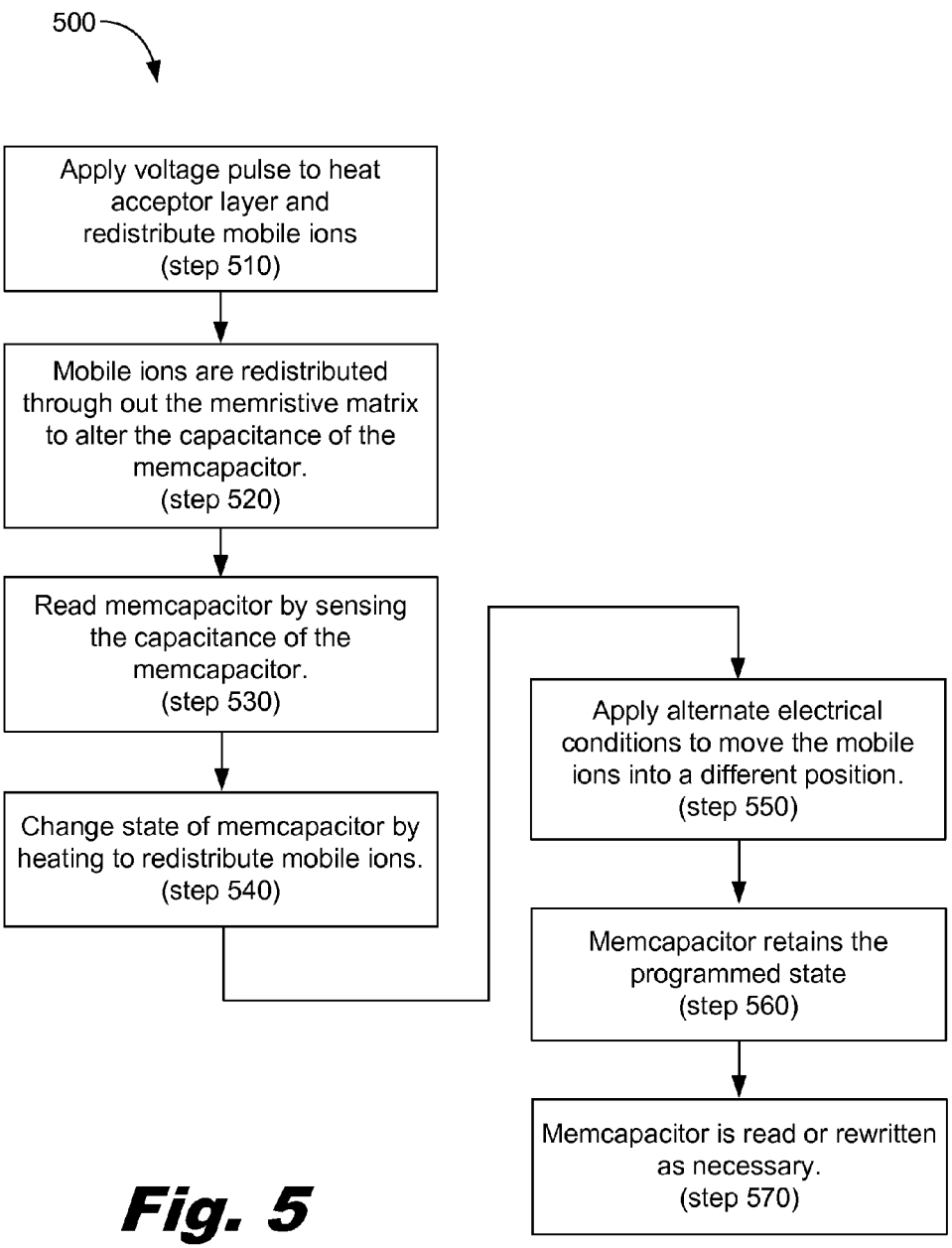
FIG. 5 is a flow chart depicting an illustrative method for using a memcapacitor for data storage, according to one embodiment of principles described herein.

FIG. 5 is a flow chart (500) which shows an illustrative process for using a memcapacitor as a data storage element. As mentioned above, to adjust the capacitance of a memcapacitor, a voltage pulse can be applied to heat the acceptor layer and redistribute any mobile ions (step 510). Based on applied voltage, the mobile ions are redistributed within the memcapacitive matrix, thus altering the capacitance of the memcapacitor (step 520). In one embodiment, the value stored by a specific memcapacitor can be determined by sensing capacitance of the memcapacitor (step 530). Its capacitance can be measured in many ways. One way is to apply a specific voltage and then measure the charge contained within the memcapacitor. The capacitance is equal to the charge divided by the voltage ($C=q/V$). In an alternative embodiment, the memcapacitor may be read by applying voltage pulses having a specific frequency to one side of the memcapacitor. The transmission of the voltage pulses through the memcapacitor to the opposite electrode is dependent on a number of factors, including the capacitance of the memcapacitor.

A typical data storage element will experience multiple reads/writes throughout its lifetime. The memcapacitor is able to change its capacitance many times and still provide proper functionality. The state of the memcapacitor can be changed by again heating the acceptor layer through a voltage pulse to redistribute the mobile ions (step 540) and applying alternate electrical conditions to move the mobile ions into a different position (step 550), thus changing the capacitance of the memcapacitor. Because the position of the mobile dopants remains stable over a given time period (in the absence of a programming voltage), the memcapacitor is able to hold its state without the need of an external power source (step 560). The memcapacitor can then be read or rewritten as necessary (step 570).

In sum, a memcapacitor uses mobile ions in a memcapacitive matrix to generate a hysteretic capacitance behavior. In one embodiment, the memcapacitor can be programmed into a high capacitance or low capacitance state by applying an appropriate programming voltage. This high capacitive or low capacitive state is stable until another programming voltage is applied. The memcapacitor has several advantages over other memory storage devices, including a relatively simple construction, small footprint, retention of its state without the application of electrical power, and does not bleed energy during operation.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A memcapacitor device comprising:
   a first electrode and a second electrode;
   a memcapacitive matrix interposed between the first electrode and the second electrode; and
   mobile dopants contained within the memcapacitive matrix which are repositioned by the application of a programming voltage across the first electrode and second electrode to alter the capacitance of the memcapacitor.

2. The device of claim 1, further comprising an acceptor layer, the acceptor layer having an electrical charge which is opposite that of the mobile dopants.

3. The device of claim 2, in which the acceptor layer divides the memcapacitive matrix into two separate memcapacitive regions.

4. The device of claim 2, in which the acceptor layer is a portion of the memcapacitive matrix which has been doped with an ion species which has an electrical charge which is opposite that of the mobile dopant species.

5. The device of claim 2, in which a low capacitance state of the memcapacitor occurs when the mobile dopants are contained within the acceptor layer.

6. The device of claim 2, in which a high capacitance state of the memcapacitor occurs when at least a portion of the mobile dopants are in electrical contact with one of the first electrode and second electrode.

7. The device of claim 1, further comprising a first blocking layer which is interposed between one of the first and second electrodes and the memcapacitive matrix, the first blocking layer preventing the mobile dopant species from escaping the memcapacitive matrix.

8. The device of claim 7, in which the first blocking layer is a dielectric material.

9. The device of claim 7, further comprising a second blocking layer, the first blocking layer being interposed between the first electrode and the memcapacitive matrix and the second blocking layer being interposed between the second electrode and the memcapacitive matrix.

10. The device of claim 1, in which a dielectric blocking layer is interposed between the first electrode and the memcapacitive matrix; the mobile dopants being moved away from the second electrode to form a low capacitance state and being moved into electrical contact with the second electrode to form a high capacitance state.

11. The device according to claim 1, further comprising:
   a crossbar architecture, the crossbar architecture comprising an upper conductor array and a lower conductor array;
   wherein a plurality of memcapacitor devices, each comprising a memcapacitive matrix having mobile dopants contained therein, are interposed between the upper conductor array and the lower conductor array at intersections between individual conductors within the upper conductor array and individual conductors within the lower conductor array, wherein said first electrode of each memcapactior device comprises a conductor of said upper conductor array and said second electrode of each memcapacitor device comprises a conductor of said lower conductor array.

12. A method for utilizing the memcapacitive device of claim 1, said method comprising:
   applying a programming voltage across said memcapacitive matrix such that mobile dopants contained within said memcapacitive matrix are redistributed and alter a capacitance of the memcapacitive device;
   removing the programming voltage; and
   applying a reading voltage to sense the capacitance of the memcapacitive device.

13. The method of claim 12, further comprising locally heating the memcapacitive matrix to increase the mobility of the mobile dopants within the memcapacitive matrix during programming.

14. The method of claim 12, in which the reading voltage is a voltage pulse train with a specific frequency applied to one electrode of the memcapacitive device, a second voltage pulse train being sensed on a second electrode, characteristics of the second voltage pulse train being dependent on the capacitance of the memcapacitive device.

15. The method of claim 12, further comprising applying a second programming voltage across the memcapacitive matrix to reconfigure the memcapacitive device to have a second and different capacitance.

16. The device of claim 11, further comprising an acceptor layer in each memcapacitor device, the acceptor layer having an electrical charge which is opposite that of the mobile dopants.

17. The device of claim 16, in which the acceptor layer divides the memcapacitive matrix into two separate memcapacitive regions.

18. The device of claim 16, in which the acceptor layer is a portion of the memcapacitive matrix which has been doped with an ion species which has an electrical charge which is opposite that of the mobile dopant.

19. The device of claim 16, in which a low capacitance state of the memcapacitor occurs when the mobile dopants are contained within the acceptor layer.

20. The device of claim 16, in which a high capacitance state of the memcapacitor occurs when at least a portion of the mobile dopants are in electrical contact with one of the first electrode and second electrode.

* * * * *

UNITED STATES PATENT AND TRADEMARK OFFICE
CERTIFICATE OF CORRECTION

| | | |
|---|---|---|
| PATENT NO. | : 8,750,024 B2 | Page 1 of 1 |
| APPLICATION NO. | : 13/256245 | |
| DATED | : June 10, 2014 | |
| INVENTOR(S) | : Bratkovski et al. | |

It is certified that error appears in the above-identified patent and that said Letters Patent is hereby corrected as shown below:

In the Claims

Column 12, line 12, Claim 11, delete "memcapactior" and insert -- memcapacitor --, therefor.

Signed and Sealed this
Eleventh Day of November, 2014

Michelle K. Lee
*Deputy Director of the United States Patent and Trademark Office*